United States Patent [19]

Noguchi

[11] Patent Number: 4,821,092
[45] Date of Patent: Apr. 11, 1989

[54] THIN FILM TRANSISTOR ARRAY FOR LIQUID CRYSTAL DISPLAY PANEL

[75] Inventor: Kesao Noguchi, Tokyo, Japan

[73] Assignee: NEC Corporation, Japan

[21] Appl. No.: 126,578

[22] Filed: Nov. 30, 1987

[30] Foreign Application Priority Data

Nov. 27, 1986 [JP] Japan ................................ 61-283320

[51] Int. Cl.4 ..................... H01L 27/12; H01L 29/78; H01L 23/48
[52] U.S. Cl. ...................................... 357/4; 357/23.7; 357/71; 350/336
[58] Field of Search ........................... 357/4, 23.7, 71; 350/334, 336

[56] References Cited

U.S. PATENT DOCUMENTS

| 3,840,695 | 10/1974 | Fischer ..................................... 357/4 |
| 4,532,536 | 7/1985 | Hatanaka et al. .................. 357/23.7 |
| 4,534,622 | 8/1985 | Harado et al. ..................... 357/23.7 |
| 4,678,282 | 7/1987 | Yamiv et al. ....................... 357/23.7 |

FOREIGN PATENT DOCUMENTS 60-183770 9/1985 Japan .................. 357/23.7
61-5577 1/1986 Japan .................. 357/23.7

OTHER PUBLICATIONS

F. F. Fang, "TFT Structure with Electrically Adjusted Threshold", *IBM Technical Disclosure Bulletin*, vol. 20 (May 1978), p. 5352.

*Primary Examiner*—J. Carroll
*Attorney, Agent, or Firm*—Laff, Whitesel, Conte & Saret

[57] ABSTRACT

A thin film transistor array board includes an insulator substrate, a matrix of gate electrodes formed on the insulator substrate and covered with a gate insulator film, a matrix of semiconductor islands formed on the gate insulator film positioning on the gate electrodes, source wirings connected to the source regions of the semiconductor islands, drain wirings connected in common to the drain regions of the semiconductor islands aligned in the same line in parallel with the columns of the gate electrode matrix, a second insulator film covering the whole surface including the drain wirings, the source wirings, the semiconductor islands and the pixel electrodes, the second insulator film having grooves exposing the drain wirings and auxiliary wirings formed in the grooves in contact with the drain wirings.

11 Claims, 2 Drawing Sheets

THIN FILM TRANSISTOR ARRAY FOR LIQUID CRYSTAL DISPLAY PANEL

BACKGROUND OF THE INVENTION

1. Field of the Invention:

The present invention relates to a thin film transistor array, and more specifically to that used for a liquid crystal display panel.

2. Description of the Related Art:

The liquid crystal display panel has a thin film transistor array board in which a plurality of thin film transistors are disposed in a matrix form. Examples disclosing such thin film transistor arrays are U.S. Pat. No. 3,840,695 granted for Albert G. Fischer on Oct. 8, 1974 and Japanese Un-examined Patent Publication No. 61-5577. Each transistor in those thin film transistor arrays has the so-called inverse-staggered structure and is formed of a gate electrode disposed on a transparent insulator substrate, a first insulator film formed on the insulator substrate to cover the gate electrode, a semiconductor layer covering the first insulator film on the gate electrode, source and drain electrodes of metal contacting upper surface of the semiconductor layer, the source and drain electrodes being separate from each other to form a gap above the gate electrode, a second insulator film covering all the structure, and a light-shield layer formed on the second insulator film above the gap between the source and drain electrodes. Each of the source and drain electrodes is formed of two layers, that is, an ohmic contact layer and a wiring layer. First of the two wiring layers is connected to a pixel electrode formed in adjacent to the semiconductor layer. Second of the two wiring layers is formed commonly to connect the corresponding wiring layers of a line of thin film transistors in the matrix.

On the thin film transistor array board, a plurality of the semiconductor layers are disposed to form the matrix, the second wiring layer covering edges of the semiconductor layers. Therefore, if the second wiring layer is formed thin, the wiring layer easily generates an open-circuit at the edges of the semiconductor layers. In order to avoid the open-circuit the second wiring layer is usually made thick, for example, 2,000 Å. If the second wiring layer is made thick, the second insulator film must be made thick, for example, 3,000 Å, to protect it from generation of many cracks at edges of the wiring layers. The cracks cause short-circuit between the light-shield layer and the source or drain electrodes. The thick film of the second insulator film simultaneously covers the pixel electrodes and lowers electric field applied to liquid crystal to deteriorate contrast of displayed image.

SUMMARY OF THE INVENTION

It is, therefore, a primary object of the present invention to provide a thin film transistor array board which is formed with high production yield and without deteriorating electrical performance.

In accordance with the present invention, there is provided a thin film transistor array board having an insulator substrate, a plurality of gate electrodes disposed on the insulator substrate in a matrix form composed of a plurality of columns and a plurality of rows, gate wiring layers connecting the gate electrodes in every rows in common, a first insulator film covering the gate electrodes, a plurality of semiconductor layers disposed on the first insulator film, each of the semiconductor layers locating above each of the gate electrodes and its periphery, a plurality of pairs of source and drain electrodes formed on the semiconductor layers, each pair of the source and drain electrodes contacting each one of the semiconductor layers to form a gap at a location above each of the gate electrodes, first column wiring layers connecting source or drain electrodes in every column in common, a second insulator film covering the source and drain electrodes and their gaps and the first column wiring layers and having apertures elongating in the column direction and exposing source or drain electrodes in every columns and first column wiring layers, and second column wiring layers running in column direction on the second insulator film and in the elongating apertures and contacting with the exposed source or drain electrodes in every columns and with the exposed portion of the first column wiring layers through the elongating apertures.

According to the present invention, the second column wiring layer is additionally provided as an upper layer on the source or drain electrodes. Even with the open-circuit of the first column wiring layer, the source or drain electrodes are maintained common-connected, by the second column wiring layer. Additionally, the second and drain electrodes and the first column wiring layers can be made thin, so that the second insulator film may be made thin to avoid generation of cracks therein.

The thin film transistor array board is suitable to form a liquid crystal display panel in which a plurality of pixel electrodes are formed in connection to the other of respective pairs of source and drain electrodes and is covered with the second insulator film to apply electric field to liquid crystal through the second insulator film. The electric field applied to the liquid crystal is improved by making the second insulator film thin, to obtain an enhanced contrast of displayed image.

BRIEF DESCRIPTION OF DRAWINGS

The above and further objects, features and advantages of the present invention will become more apparent from the following detailed description of embodiments taken in conjunction with the accompanying drawings, wherein.

DESCRIPTION OF THE PREFERRED EMBODIMENT

Figure 1:
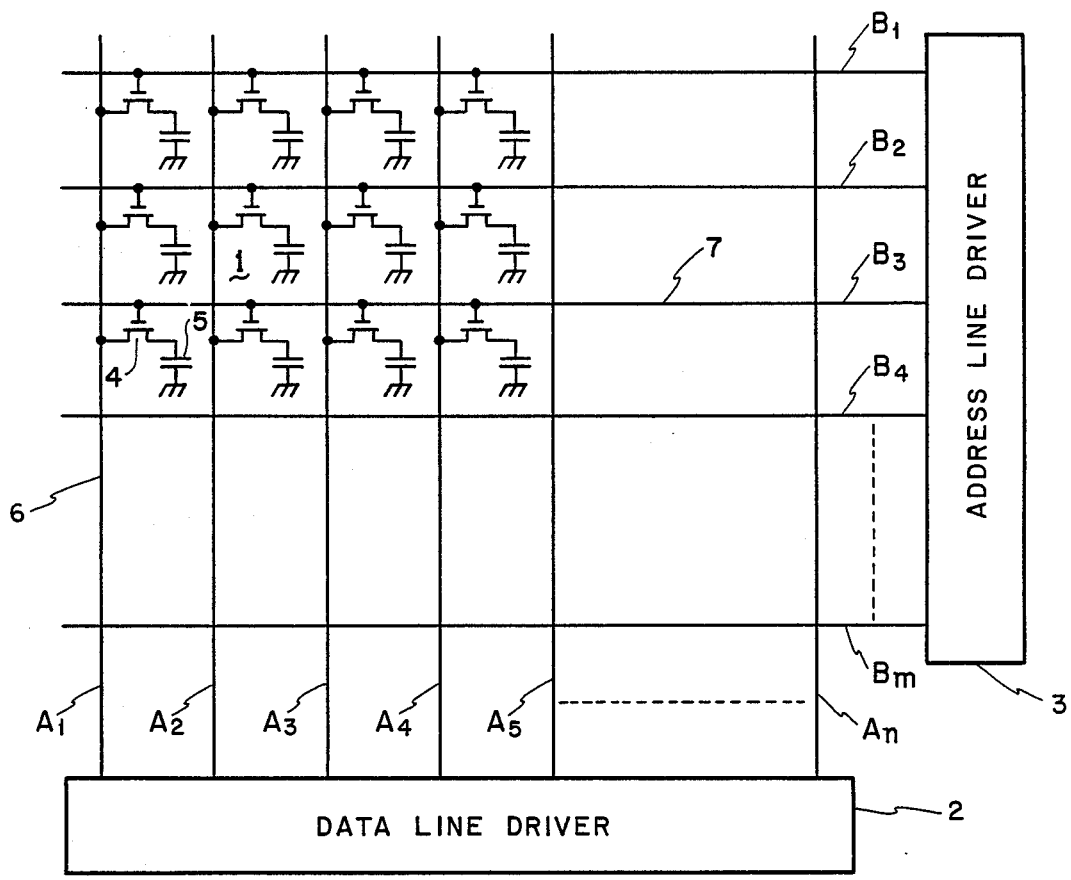
FIG. 1 shows a circuit diagram of a liquid crystal display panel.

A liquid crystal display panel has an equivalent circuit shown in FIG. 1. A plurality of data lines $A_1$, $A_2$, $A_3$, $A_4$, $A_5$....$A_n$ and a plurality of address lines $B_1$, $B_2$, $B_3$, $B_4$....$B_m$ cross orthogonally to form a lattice. At every crossing points, a picture element 1 is disposed. The picture element 1 has a thin film transistor 4 having a gate connected to an address line 7, a drain connected to a data line 6 and a capacitor 5 formed of a pixel electrode, a grounded common electrode and a liquid crystal interposed therebetween. Thin film transistors connected to address lines applied with address signals and data lines applied with data signals turn on to change the liquid crystal in the capacitors connected to the transistors into opaque state.

Figure 4:
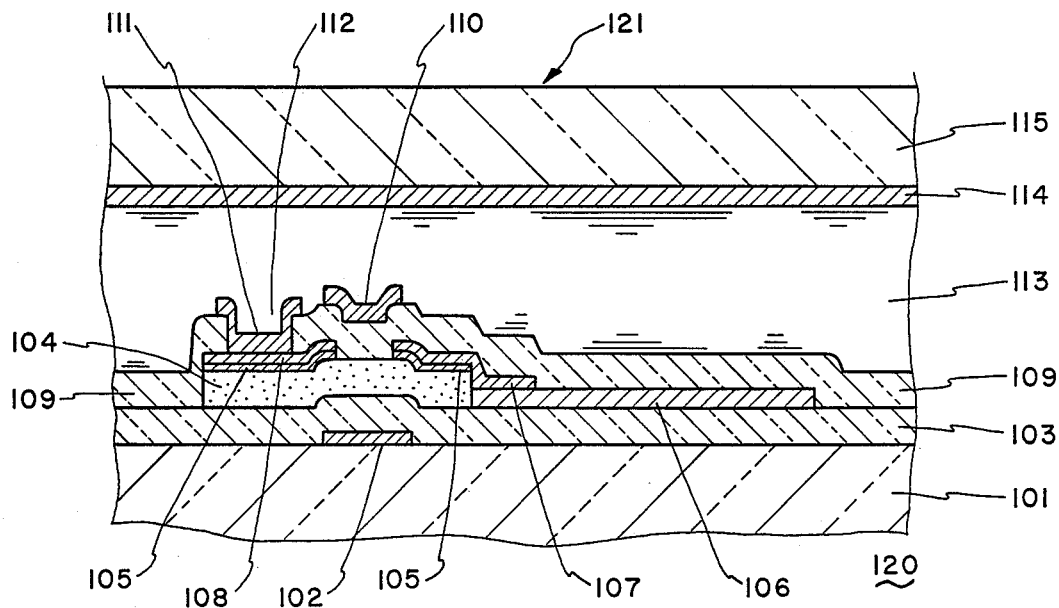
FIG. 4 shows a sectional view of a liquid crystal display panel using the thin film transistor array board of the present invention, the section of the thin film transistor array board corresponding to the line B—B' of FIG. 2.
Figure 3:
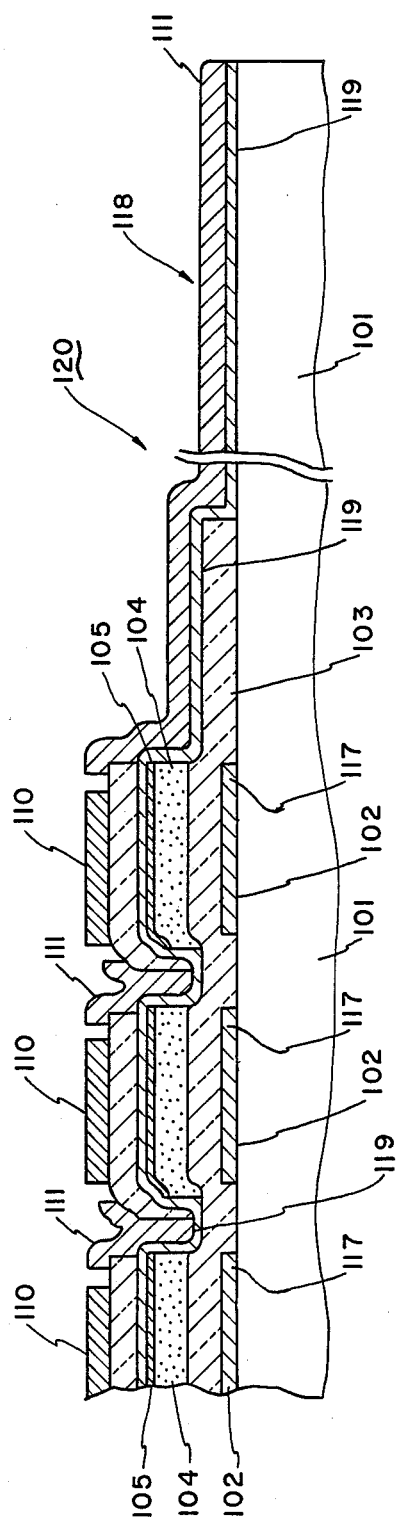
FIG. 3 shows a sectional view taken along a line A—A' of FIG. 2.
Figure 2:
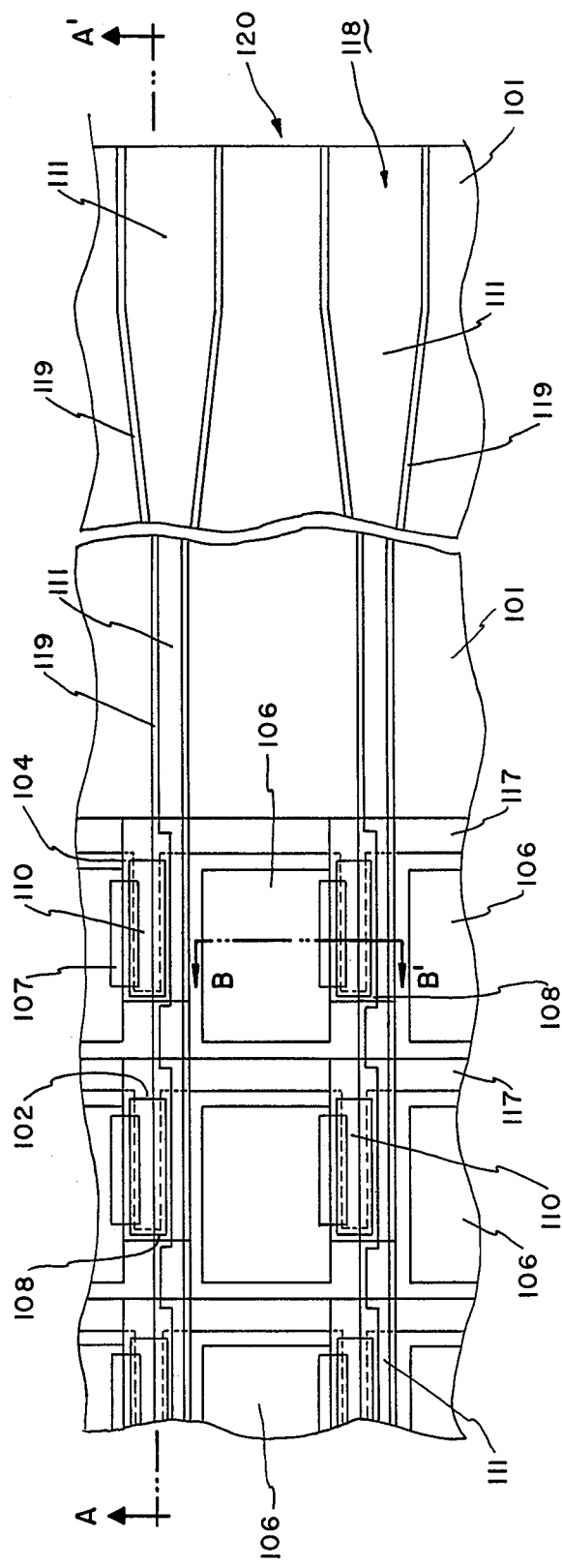
FIG. 2 shows a partial plan view showing a thin film transistor array board according to a preferred embodiment of the present invention.

The liquid crystal display panel is formed of a thin film transistor array board 120, a common electrode board 121 and a liquid crystal interposed therebetween, as shown in FIG. 4. The common electrode board 121 is composed of a transparent insulator substrate 115 and a common electrode layer 114 metalized on the substrate 115. The thin film transistor array board 120 is also shown in FIG. 2 in plan view and in FIG. 3 in sectional view.

A thin film transistor array is formed on a glass substrate 101 or other transparent insulator substrate. A plurality of gate electrodes 102 of Cr having a thickness of 1,500 Å are formed on the substrate 101 in form of a matrix. The gate electrodes 102 in the same row lines are electrically connected in common with address lines 117. An insulator film 103 of SiNx having a thickness of 2,000 Å is formed on the glass substrate 101 with covering the gate electrodes 102 so as to operate as a gate insulator film but is not formed on the electrode pad region of the substrate 101. On the insulator film 103 above the gate electrodes 102 and their peripheries, amorphous silicon (a-Si:H) films 104 having a thickness of 1,500 Å are formed without impurity doped. Pixel electrodes 106 of ITO (indium-tin-oxide) having a thickness of 1,000 Å or other transparent metal are formed in adjacent to respective amorphous silicon films 104. Ohmic contact layers 105 of n+-amorphous silicon (a-Si:H) having a thickness of 100 Å are formed on source and drain regions of respective amorphous silicon films 104. On the contact layers 105 on the source regions, source wirings are deposited so as to extend on the pixel electrode 106. Drain wirings 108 are formed on the ohmic contact layers 105. The drain wirings 108 are extended on the insulator film 103 as data lines 119. The source wirings 107, the drain electrodes 108 and the data lines 119 are formed in the same process with the ITO or a metal such as Ti or Cr having a thickness in a range from 500 to 1,000 Å. The data lines 119 electrically connect the drain electrodes 108 in the same columns in common and are lead-out to the edge portion of the glass substrate 101 where the data lines 119 are widened and directly disposed on the substrate 101 to form pad electrodes 118. A passivation film 109 of SiOx (x=1.6 to 2.4) having a thickness of 2,000 Å or SiNx (x=1.1 to 1.5) having a thickness of 3,000 Å covers the source and drain wirings 107 and 108, the address and data lines 117 and 119, the amorphous silicon films 104 exposing between the source and drain wirings 107 and 108, the pixel electrodes 106 and the insulator film 103. the passivation film 109 has grooves or elongated apertures which extend from one edge of the array to the opposite edge and expose a part (partial width) of the drain wirings 108 and the data lines 119 throughout each column. The length of each groove (aperture) is as long as each column and its width is smaller than the width of the drain wiring 108 and the data line 119. Auxiliary column wiring layers 111 are additionally formed in every columns, overlapping every data lines 119. The width of the auxiliary column wiring layer 111 is larger than that of the groove in the passivation film 109, so that the layers 111 are formed within the very grooves to contact with the exposed portion of the drain wirings 108 and the data lines 119 and their side edges are extended onto the film 109 on the both sides of each groove. The wirings 111 are formed of Al or Cr in a thickness within a range from 2,000 Å to 5,000 Å by evaporation process and selective etching process. Through the same processes, light-shielding metal islands 110 are formed on the film 109 above the gate electrodes.

The thin film transistor array board 120 according to the preferred embodiment of the present invention has the auxiliary wiring 111 contacting with the drain wirings 108 and the data lines 119. Therefore, the data lines 119 can be made thin to an extend that open-circuit may occur at edges of the amorphous silicon films 104, because the broken wirings are connected by the auxiliary wirings 111 which can be made so thick that open-circuit may not occur. The thin data lines 119 allow the passivation film 109 to be thin enough to avoid cracks. The manufacturing loss due to the open-circuit of the data lines and cracks of the passivation film 109 can be reduced to a value of 0.01% to 0.001% from the conventional value of 0.5 to 1%. Moreover, since the passivation film 109 can be made thin, electric field applied to the liquid crystal 113 from the pixel electrodes 106 becomes strong to achieve a high contrast image.

Although only one preferred embodiment has been explained, many modifications are applicable to the preferred embodiment. The amorphous silicon can be extended under all the data lines 119 with contacting thereto. It is sufficient that each auxiliary wiring 111 is partially connected to each data line 119. Therefore, the auxiliary wiring can be absent at the portions over the drain wirings 108. Furthermore, the pixel electrodes 106 may be formed in the same process as the formation of the source wirings with the same material. The amorphous silicon (a-Si:H) may be replaced with other semiconductor material such as II–IV compound semiconductor or polycrystalline silicon.

What is claimed is:

1. A thin film transistor array comprising:
   an insulator substrate;
   a plurality of gate electrodes formed on said insulator substrate in form of a matrix of columns and rows;
   a plurality of row connecting means formed on said insulator substrate for connecting said gate electrodes in the same rows in common;
   a first insulator film covering at least said gate electrodes and said row connecting means;
   a plurality o f semiconductor layers formed on said first insulator film at locations above said gate electrodes and peripheral portions thereof, each of said semiconductor layers having a source region, a drain region and a channel region locating therebetween;
   a plurality of source electrodes connected to said source regions of said semiconductor layers, respectively;
   a plurality of drain electrodes connected to said drain regions of said semiconductor layers, respectively;
   a plurality of first column wiring layers connecting the drain electrodes in the same columns in common;
   a second insulator film covering at least said channel region, said source electrodes, said drain electrodes and said first column wiring layers, said second insulator film having apertures elongating in the column direction along said first column wiring layers and exposing at least portions of said first column wiring layers; and a plurality of second column wiring layers running along said first column wiring layers and formed in said apertures on the exposed portions of said first column wiring layers.

2. A thin film transistor array as claimed in claim 1, wherein said insulator substrate is made of transparent material.

3. A thin film transistor array as claimed in claim 2, wherein said first column wiring layers having a thickness within a range between 500 Å and 1,000 Å.

4. A thin film transistor array as claimed in claim 3, wherein said second insulator film has a thickness within a range between 1,000 Å and 2,000 Å.

5. A thin film transistor arrays as claimed in claim 2, wherein said semiconductor layers are continuously formed along said column.

6. A thin film transistor array as claimed in claim 2, further comprising a plurality of pixel electrodes formed in adjacent to respective semiconductor layers, said pixel electrodes being respectively connected to said source electrodes and covered with said second insulator film.

7. A thin film transistor array as claimed in claim 6, further comprising a plurality of light-shielding layer formed on said second insulator film locating on said channel regions of said semiconductor layers.

8. A thin film transistor array comprising an insulator substrate, a plurality of gate electrodes disposed on the insulator substrate in a matrix form composed of a plurality of columns and a plurality of rows, gate wiring layers connecting the gate electrodes in same rows in common, a first insulator film covering said gate electrodes, a plurality of semiconductor layers disposed on said first insulator film, each of said semiconductor layers locating above each of the gate electrodes and its periphery, a plurality of pairs of source and drain electrodes formed on said semiconductor layers, each pair of said source and drain electrodes contacting each one of said semiconductor layers to form a gap at a location above each of said gate electrodes, first column wiring layers connecting source or drain electrodes in same column in common, a second insulator film covering said source and drain electrodes and their gaps and said first column wiring layers and having apertures elongating in the column direction and exposing source or drain electrodes in every columns and said first column wiring layers, and second column wiring layers running in column direction on the second insulator film and in the elongating aperture and contacting with the exposed source or drain electrodes in every columns and with the exposed portion of said first column wiring layers through the elongating apertures.

9. A liquid crystal display panel having a thin film transistor array board, a common electrode board and liquid crystal interposed therebetween said thin film transistor array board comprising:

a substrate of a transparent insulator;

a plurality of gate electrodes formed in a matrix of columns and rows, said gate electrodes aligned in the same row being connected in common;

a first insulator film formed on said substrate to cover said gate electrodes;

a plurality of semiconductor islands formed on said first insulator locating on said gate electrodes and their peripheries, each of said semiconductor islands having a channel region locating above said gate electrode and source and drain regions locating on both sides of said channel region;

a plurality of pixel electrodes respectively formed on said first insulator film adjacent to said source region of said semiconductor island;

a plurality of source wirings respectively connecting said source region and said pixel electrode;

a plurality of drain wirings respectively connecting said drain regions of said semiconductor islands located on said gate electrodes aligned in the same column;

a second insulator film covering said source and drain wirings, said channel regions of said semiconductor islands and said pixel electrodes, said second insulator film having grooves exposing said drain wirings;

a plurality of auxiliary wiring layers formed on said second insulator film, each of said auxiliary wiring layers filling respective one of said grooves to connect with said drain wiring exposed in said one of said grooves and;

a plurality of light-shield layers, formed on said second insulator film located on said channel regions of said semiconductor islands, said light-shield layers being separated from said auxiliary wiring layers.

10. A liquid crystal display panel as claimed in claim 8, wherein said drain wirings and said source wiring have a thickness within a range between 500 Å and 1,000 Å.

11. A liquid crystal display panel as claimed in claim 9, wherein said second insulator film has a thickness within a range between 1,000 Å and 2,000 Å.

* * * * *